United States Patent
Gwo et al.

(10) Patent No.: US 8,242,523 B2
(45) Date of Patent: Aug. 14, 2012

(54) III-NITRIDE LIGHT-EMITTING DIODE AND METHOD OF PRODUCING THE SAME

(75) Inventors: Shang-Jr Gwo, Hsinchu (TW); Hon-Way Lin, Hsinchu (TW); Yu-Jung Lu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 82 days.

(21) Appl. No.: 12/846,443

(22) Filed: Jul. 29, 2010

(65) Prior Publication Data
US 2012/0025232 A1   Feb. 2, 2012

(51) Int. Cl.
*H01L 33/00* (2010.01)
*H01L 21/00* (2006.01)

(52) U.S. Cl. .............. 257/96; 257/E33.008; 438/46

(58) Field of Classification Search .......... 257/94, 257/97, 79, E33.008, 13, 9, 96; 438/22, 24, 438/46
See application file for complete search history.

(56) References Cited

U.S. PATENT DOCUMENTS
2005/0194598 A1* 9/2005 Kim et al. .............. 257/79

OTHER PUBLICATIONS

Yang et al., "Fabricated nano-disk InGaN/GaN multi-quantum well of the inverse hexagonal pyramids", 2008, Journal of Physics and Chemistry of Solids, vol. 68, pp. 589-592.*

Li et al. "Formation of GaN nanorods by a sublimation method", 2000, Journal of Crystal Growth, vol. 213, pp. 408-410.*

Schubert, E. F. & Kim, J. K., "Sold-state light sources getting smart," *Science*, May 27, 2005, pp. 1274-1278, vol. 308.

Krames, M. R., Shchekin, O. B., Mueller-Mach, R., Mueller, G. O., Zhou, L., Harbers, G. & Craford, M. G., "Status and future of high-power light-emitting diodes for solid-state lighting," *J. Disp. Technol.*, Jun. 2007, pp. 160-175, vol. 3—No. 2.

Mukai, T., Yamada, M. & Nakamura, S., "Characteristics of InGaN-based uv/blue/green/amber/red light-emitting diodes," *Jpn. J. Appl. Phys.*, Jul. 1999, pp. 3976-3981, vol. 38.

Xu, T., Nikiforov, A. Yu., France, R., Thomidis, C., Williams, A. & Moustakas, T. D., "Blue-green-red LEDs based on InGaN quantum dots grown by plasma-assisted molecular beam epitaxy." Phys. Stat. Sol. A, 2007, pp. 2098-2102, vol. 204.

Humphreys, C. J., "Solid-state lighting," *MRS Bull.*, Apr. 2008, pp. 459-470, vol. 33.

Fiorentini, V., Bernardini, F., Della Sala, F., Di Carlo, A. & Lugli, P., "Effects of macroscopic polarization in III-V nitride multiple quantum wells," *Phy. Rev. B.*, Sep. 15, 1999, pp. 8849-8858, vol. 60—No. 12.

(Continued)

*Primary Examiner* — A. Sefer
*Assistant Examiner* — Nikolay Yushin
(74) *Attorney, Agent, or Firm* — Muncy, Geissler, Olds & Lowe, PLLC

(57) ABSTRACT

Embodiments of the present invention provides III-nitride light-emitting diodes, which primarily include a first electrode, a n-type gallium nitride (GaN) nanorod array consisted of one or more n-type GaN nanorods ohmic contacting with the first electrode, one or more indium gallium nitride (InGaN) nanodisks disposed on each of the n-type GaN nanorods, a p-type GaN nanorod array consisted of one or more p-type GaN nanorods, where one p-type GaN nanorod is disposed on top of the one ore more InGaN nanodisks disposed on each of the n-type GaN nanorods, and a second electrode ohmic contacts with the p-type GaN nanorod array.

30 Claims, 7 Drawing Sheets

OTHER PUBLICATIONS

Waltereit, P., Brandt, O., Trampert, A., Grahn, H. T., Menniger, J., Ramsteiner, M., Reiche, M. & Ploog, K. H., "Nitride semiconductors free of electrostatic fields for efficient white light-emitting diodes," *Nature*, Aug. 24, 2000, pp. 865-868, vol. 406.

Masui, H., Nakamura, S., DenBaars, S. P. & Mishra, U. K., "Nonpolar and semipolar III-nitride light-emitting diodes: Achievements and challenges," *IEEE Trans. Electron Devices*, Jan. 2010, pp. 88-100, vol. 57—No. 1.

Chen, H.-Y., Lin, H.-W., Shen, C.-H. & Gwo, S., "Structure and photoluminescence properties of epitaxially oriented GaN nanorods grown on Si(111) by plasma-assisted molecular-beam epitaxy." *Appl. Phys. Lett.*, 2006, pp. 243105-1-243105-3, vol. 89.

\* cited by examiner

III-NITRIDE LIGHT-EMITTING DIODE AND METHOD OF PRODUCING THE SAME

FIELD OF THE INVENTION

The present invention relates to III-nitride light-emitting diodes and their forming methods.

DESCRIPTION OF THE PRIOR ART

Solid-state light sources based on white light emitting diode (LED) technology have gained much attention because of their tremendous potential for energy-efficient general illumination applications. In white LEDs, the luminous efficacy and color rendering can be controlled by light mixing of polychromatic (e.g., red, yellow, green, blue) emitters[1,2]. At present, the indium gallium nitride (InGaN) compound semiconductor alloys are considered as the most promising material system for white LEDs since the direct band gaps of $In_xGa_{1-x}N$ ($0 \leq x \leq 1$) can be continuously tuned from the near-infrared (0.6 eV, InN) to near-UV (3.4 eV, GaN) region, including the entire visible spectrum. However, this potential is limited by the dramatic drop in the InGaN emission efficiency at longer wavelengths[2-5]. To date, efficient InGaN LEDs are only available in the blue region. Thus, monolithic white LEDs are typically realized by the luminescence down-conversion technique using yellow phosphors, such as cerium-doped yttrium aluminum garnet. The efficiency and light quality of phosphor-converted devices, however, are still imperfect due to the Stokes shift loss and limited color rendering[1,2]. Furthermore, optimized color display devices would require full-visible-spectrum emitters. Thus, a major current research focus is to improve the InGaN emission efficiency at longer wavelengths. Especially, the spectral range between 550 and 590 nm is the well known "green-yellow gap," where the highest spectral response region of the human eye resides in and none of the existing semiconductors can be used to make high-efficiency LEDs[2,5].

The origin of the wavelength-dependent emission efficiency can be attributed mainly to the large lattice mismatch between InN and GaN (~11%) and the polar nature of their crystal structure. High-quality InGaN LEDs based on conventional planar InGaN/GaN multiple quantum well structures are currently grown along the polar c-axis of the wurtzite crystal structure. Therefore, growth of high-In-content InGaN/GaN quantum wells would unavoidably result in a high density of defects and huge internal electrostatic (piezoelectric) fields (>1 MV/cm)[6,7]. The internal fields in the InGaN wells spatially separate the electron and hole wave functions, i.e., quantum confined Stark effect (QCSE), making highly efficient longer-wavelength LEDs difficult to achieve based on polar c-plane structures. For the blue (low-In-content) InGaN LEDs, the carrier localization phenomenon and ultrathin quantum well structures (about 2-4 nm in width for nearly all commercial InGaN LEDs or laser diodes) could alleviate the effects of high defect density and QCSE. Unfortunately, these are not applicable in the case of high-In-content InGaN quantum wells because of the lack of strong charge localization and increasingly large internal electrostatic fields. Besides, there are other QCSE- and ultrathin-well-related detrimental features of c-plane InGaN LEDs, including efficiency droop and blue-shift of the emission wavelength (due to carrier screening of internal electrostatic fields) with increasing drive current. Therefore, avoiding QCSE in InGaN LEDs has been considered as an important milestone to realize the ultimate solid-state light sources for general illumination.

In the past few years, tremendous efforts have been made to solve the QCSE obstacle by using the nonpolar (e.g., a- or m-plane) InGaN/GaN structures grown on various substrates[7,8]. However, the nonpolar approach has its own limitations and challenges[8] such that ideal solutions for the green-yellow-gap and efficiency droop issues are still lacking. [Reference 1: Schubert, E. F. & Kim, J. K. Sold-state light sources getting small. Science 308, 1274-1278 (2005); Reference 2: Krames, M. R., Shchekin, O. B., Mueller-Mach, R., Mueller, G. O., Zhou, L., Harbers, G. & Craford, M. G. Status and future of high-power light-emitting diodes for solid-state lighting. J. Disp. Technol. 3, 160-175 (2007); Reference 3: Mukai, T., Yamada, M. & Nakamura, S. Characteristics of InGaN-based uv/blue/green/amber/red light-emitting diodes. Jpn. J. Appl. Phys. 38, 3976-3981 (1999); Reference 4: Xu, T., Nikiforov, A. Yu., France, R., Thomidis, C., Williams, A. & Moustakas, T. D. Blue-green-red LEDs based on InGaN quantum dots grown by plasma-assisted molecular beam epitaxy. Phys. Stat. Sol. A 204, 2098-2102 (2007); Reference 5: Humphreys, C. J. Solid-state lighting. MRS Bull. 33, 459-470 (2008); Reference 6: Fiorentini, V., Bernardini, F., Della Sala, F., Di Carlo, A. & Lugli, P. Effects of macroscopic polarization in III-V nitride multiple quantum wells. Phy. Rev. B 60, 8849-8858 (1999); Reference 7: Waltereit, P., Brandt, O., Trampert, A., Grahn, H. T., Menniger, J., Ramsteiner, M., Reiche, M. & Ploog, K. H. Nitride semiconductors free of electrostatic fields for efficient white light-emitting diodes. Nature 406, 865-868 (2000); Reference 8: Masui, H., Nakamura, S., DenBaars, S. P. & Mishra, U. K. Nonpolar and semipolar III-nitride light-emitting diodes: Achievements and challenges. IEEE Trans. Electron Devices 57, 88-100 (2010).]

Therefore, it would be advantageous to provide light-emitting diodes to overcome the green-yellow-gap and efficiency droop issue.

SUMMARY OF THE INVENTION

An object of the present invention is to provide light-emitting diodes having better performance and properties than prior art. In addition, the green-yellow-gap and efficiency droop issue can be overcome. Moreover, a simple, economical, efficient method to produce such light-emitting diodes is also needed.

According to the object and other objects, one embodiment of the present invention provides a first electrode, a n-type gallium nitride (GaN) nanorod array consisted of n-type GaN nanorods ohmic contacting with the first electrode, one or more indium gallium nitride (InGaN) nanodisks disposed on each of the n-type GaN nanorods, a p-type GaN nanorod array consisted of p-type GaN nanorods, wherein one p-type GaN nanorod is corresponded to one n-type GaN nanorod and is disposed on top of the one ore more InGaN nanodisks of the corresponded n-type GaN nanorod; and a second electrode ohmic contacting with the p-type GaN nanorod array.

In one embodiment, the one or more InGaN nanodisks comprise two or more InGaN nanodisks, and a GaN barrier is interposed between each two of the InGaN nanodisks.

In one embodiment, the one or more InGaN nanodisks comprise two or more InGaN nanodisks, and electroluminescence emissions from the one or more InGaN nanodisks are monochromatic or polychromatic.

In one embodiment, the electroluminescence emissions from the light-emitting diode are polarized.

In one embodiment, each indium gallium nitride (InGaN) nanodisk has a thickness equal to or more than 10 nm.

In one embodiment, each indium gallium nitride (InGaN) nanodisk has a thickness about 10 nm to 40 nm.

In one embodiment, the wavelengths of the electroluminescence emissions of the light-emitting diode are not significantly altered when the injection current is increased.

In one embodiment, the color temperature emitted from the light-emitting diode is not siginificantly dependent on the injection currents.

In one embodiment, the color temperature emitted from the light-emitting diode maintains at about 6000 K for injection currents larger than 5 mA.

In one embodiment, the relative external quantum efficiency (EQE) is monotonously increased when the current density of injection currents is increased to above 50 A/cm$^2$.

In one embodiment, the first electrode or the second electrode is a transparent electrode, and each of the p-type GaN nanorods or n-type GaN nanorods near the transparent electrode has two ends wherein one end near the transparent electrode is wider than the other end, forming a continuously connected nanorod network without significant current leakage.

According to the object and other objects, one embodiment of the present invention provides a single nanorod light-emitting diode, comprising a first electrode, an n-type gallium nitride (GaN) nanorod ohmic contacting with the first electrode, one or more indium gallium nitride (InGaN) nanodisks disposed on the n-type GaN nanorod, a p-type GaN nanorod disposed on top of the one ore more InGaN nanodisks, and a second electrode ohmic contacting with the p-type GaN nanorod.

The single nanorod light-emitting diode has similar features to the nanorod array light-emitting diode. In particular, in one embodiment, the electroluminescence emissions from the single nanorod light-emitting diodes have a polarization ratio substantially independent to the wavelengths of the electroluminescence emissions and the diameter of the one or more InGaN nanodisks.

In one embodiment, current density exerted to the single nanorod light emitting diode reaches 8,000 A/cm$^2$ or more.

In one embodiment, the single nanorod light-emitting diode is used as the light source for subwavelength optical lithography in the contact or proximity printing mode for photoresists photo-active at the emission wavelengths, wherein the photoresists are within the near-field of the single rod light-emitting diode. The subwavelength optical lithography can be performed by raster scanning the single rod light-emitting diode with respect to the photoresists.

In one embodiment, The single rod light-emitting diode is used as the light source for subwavelength optical imaging of objects placed within the within the near-field of the single rod light-emitting diode. The subwavelength optical imaging can be performed by raster scanning the single rod light-emitting diode with respect to the imaged objects.

According to the object and other objects, one embodiment of the present invention provides a method for producing an light-emitting diode, which primarily includes: forming a first electrode; forming a n-type gallium nitride (GaN) nanorod array consisted of one or more n-type GaN nanorods that ohmic contacts with the first electrode; forming one or more indium gallium nitride (InGaN) nanodisks on each of the n-type GaN nanorod; forming a p-type GaN nanorod array consisted of one or more p-type GaN nanorods, wherein one p-type GaN nanorod is formed on top of the one ore more InGaN nanodisks of one n-type GaN nanorod; and forming a second electrode that ohmic contacts with the p-type GaN nanorod array.

In one embodiment, the n-type or p-type gallium nitride (GaN) nanorods are wurtzite-type single crystals in which the axial growth direction of the nanorods is along the wurtzite c-axis.

In one embodiment, the n-type gallium nitride (GaN) nanorod array, the indium gallium nitride (InGaN) nanodisks, and the p-type gallium nitride (GaN) nanorod array are formed by a nitrogen-plasma-assisted molecular beam epitaxy method.

In one embodiment, the nitrogen-plasma-assisted molecular beam epitaxy (PAMBE) is performed under nitrogen-rich conditions, in comparison to a group-III/nitrogen flux ratio used for an III-nitride film growth.

In one embodiment, the emission wavelength of each InGaN nanodisk is individually controlled by its growth temperature and the group-III beam fluxes.

In one embodiment, the one or more indium gallium nitride (InGaN) nanodisks comprises three T1 InGaN nanodisks, one T2 InGaN nanodisk, and one T3 InGaN nanodisk, and the growth temperatures for T1, T2, and T3 are $T_1 > T_2 > T_3$.

In one embodiment, when forming two or more InGaN nanodisks, a GaN barrier is further formed between each two of the InGaN nanodisks.

BRIEF DESCRIPTION OF THE DRAWINGS

FIG. 1c is a micro-EL image (20 mA) under a 100× objective revealing full-visible-spectrum emissions from the white LED shown in FIG. 1a.

DESCRIPTION OF THE PREFERRED EMBODIMENT

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well-known process operations and components are not been described in detail in order not to unnecessarily obscure the present invention. While drawings are illustrated in details, it is appreciated that the quantity of the disclosed components may be greater or less than that disclosed, except expressly restricting the amount of the components. Wherever possible, the same or similar reference numbers are used in drawings and the description to refer to the same or like parts.

The primary object of the present invention can be achieved by using self-assembled GaN nanorod arrays on Si substrates as templates for growing strain-free InGaN/GaN nanorod heterostructures. The most salient feature of the nanorod-based approach is the absence of piezoelectric polarization effects, allowing thick (tens of nm) InGaN nanodisk emitter structures in the full visible range. By using this approach, the present invention demonstrates both monolithic, phosphor-free white (polychromatic) nanorod-array LEDs and polarized full-color (monochromatic) single-nanorod LEDs.

A phosphor-free white, polychromatic nanorod-array LEDs according to a preferred embodiment is described below. Vertically self-aligned GaN nanorod arrays were grown along the wurtzite c-axis on 3-inch, n-type Si(111) substrates by plasma-assisted molecular-beam epitaxy (PAMBE) [Chen, H.-Y., Lin, H.-W., Shen, C.-H. & Gwo, S. Structure and photoluminescence properties of epitaxially oriented GaN nanorods grown on Si(111) by plasma-assisted molecular-beam epitaxy. *Appl. Phys. Lett.* 89, 243105 (2006)]. The PAMBE-grown GaN nanorod arrays exhibit the properties of strain- and dislocation-free single crystals, which can be used as nanostructured compliant templates for growing strain-free InGaN nanodisks.

Figure 1A:
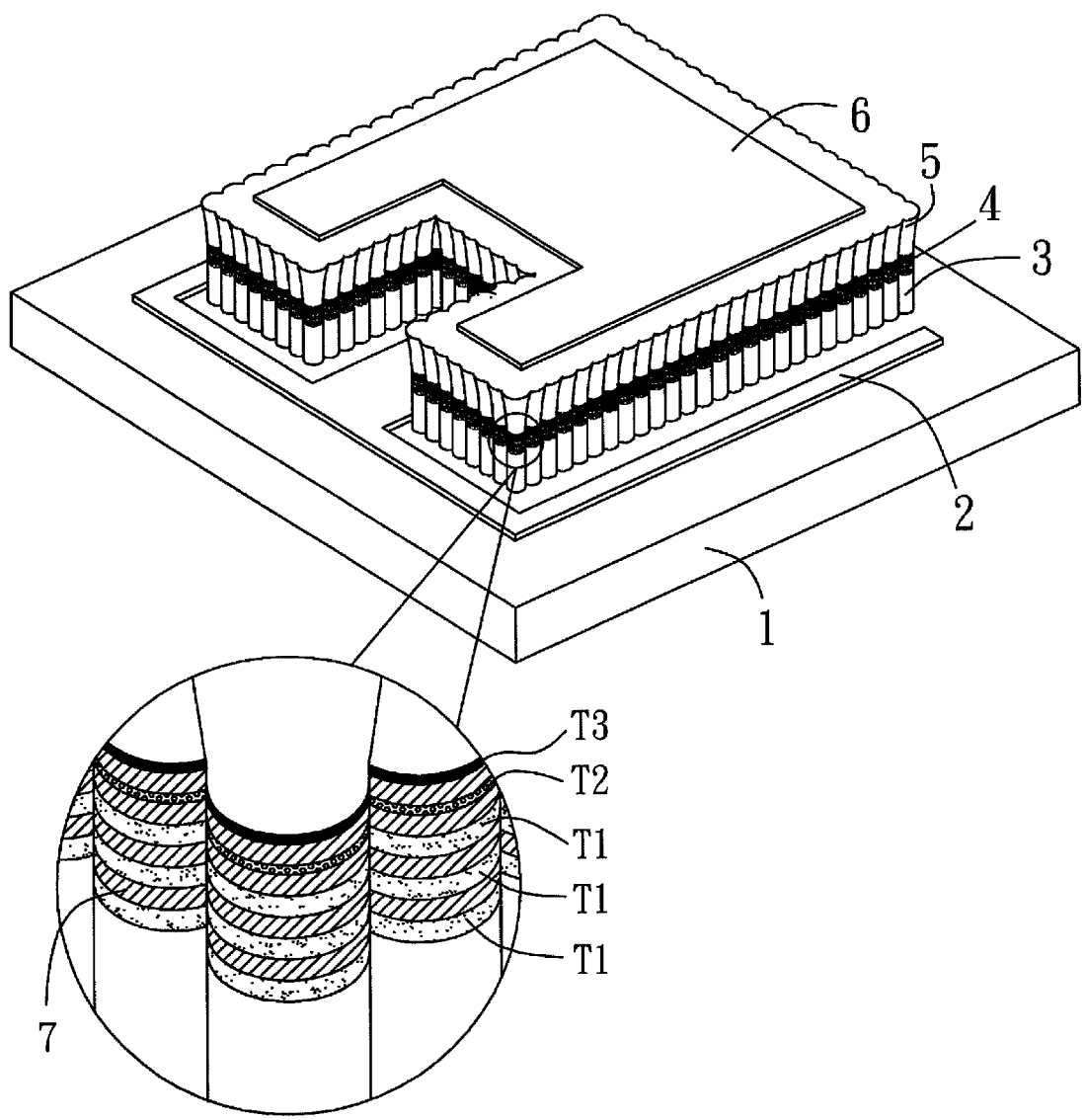
FIG. 1a is a schematic diagram of LED structure for generating white light according to an embodiment of the present invention.
Figure 1B:
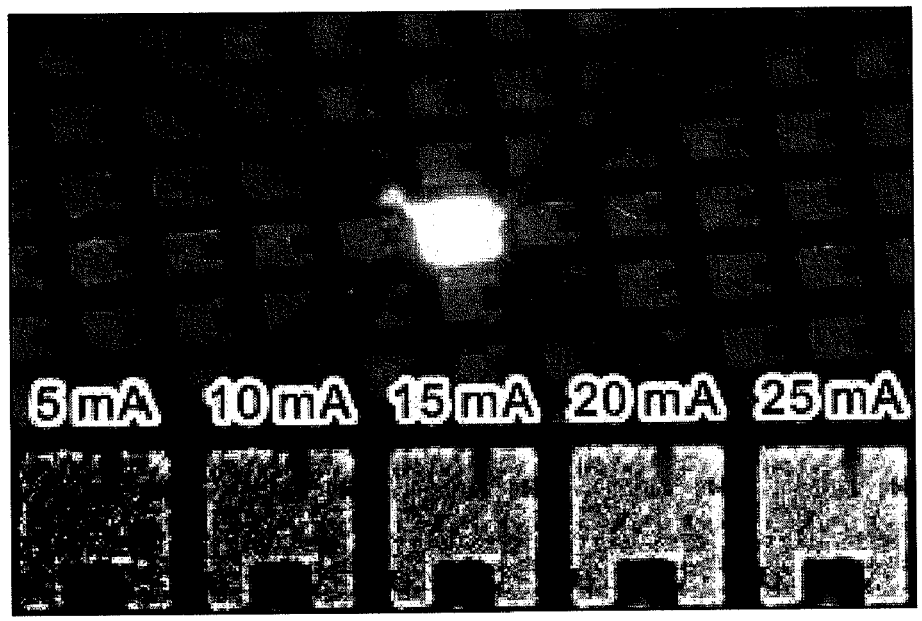
FIG. 1b is a photograph of LED of FIG. 1a, which emits white light with 20 mA injection current, and micro-electroluminescence (EL) images shown below are acquired under a 10× objective at various injection currents.
Figure 1C:
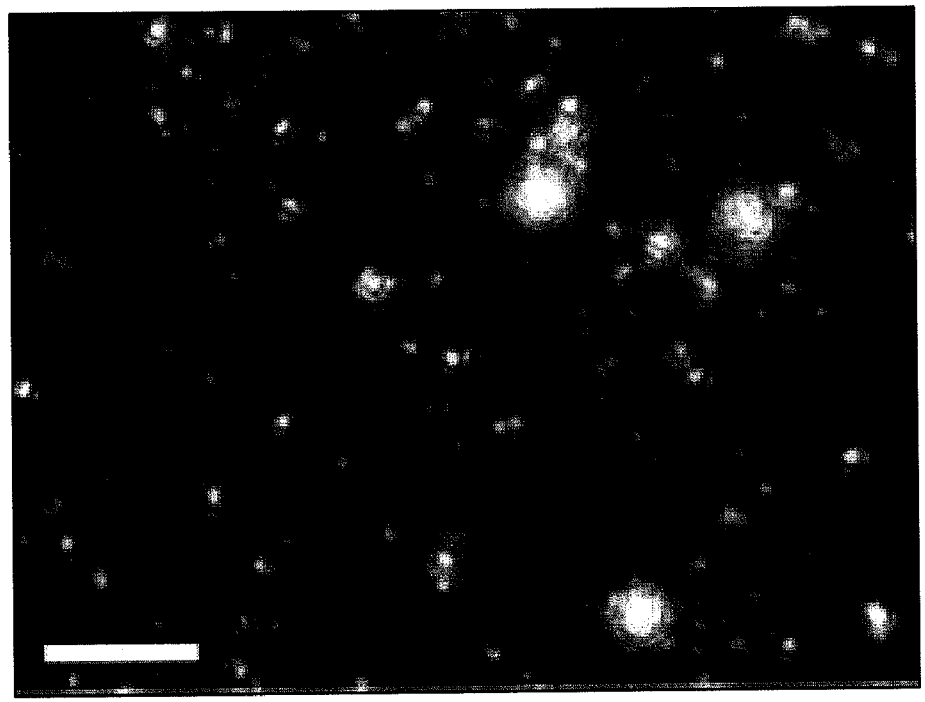
Figure 1D:
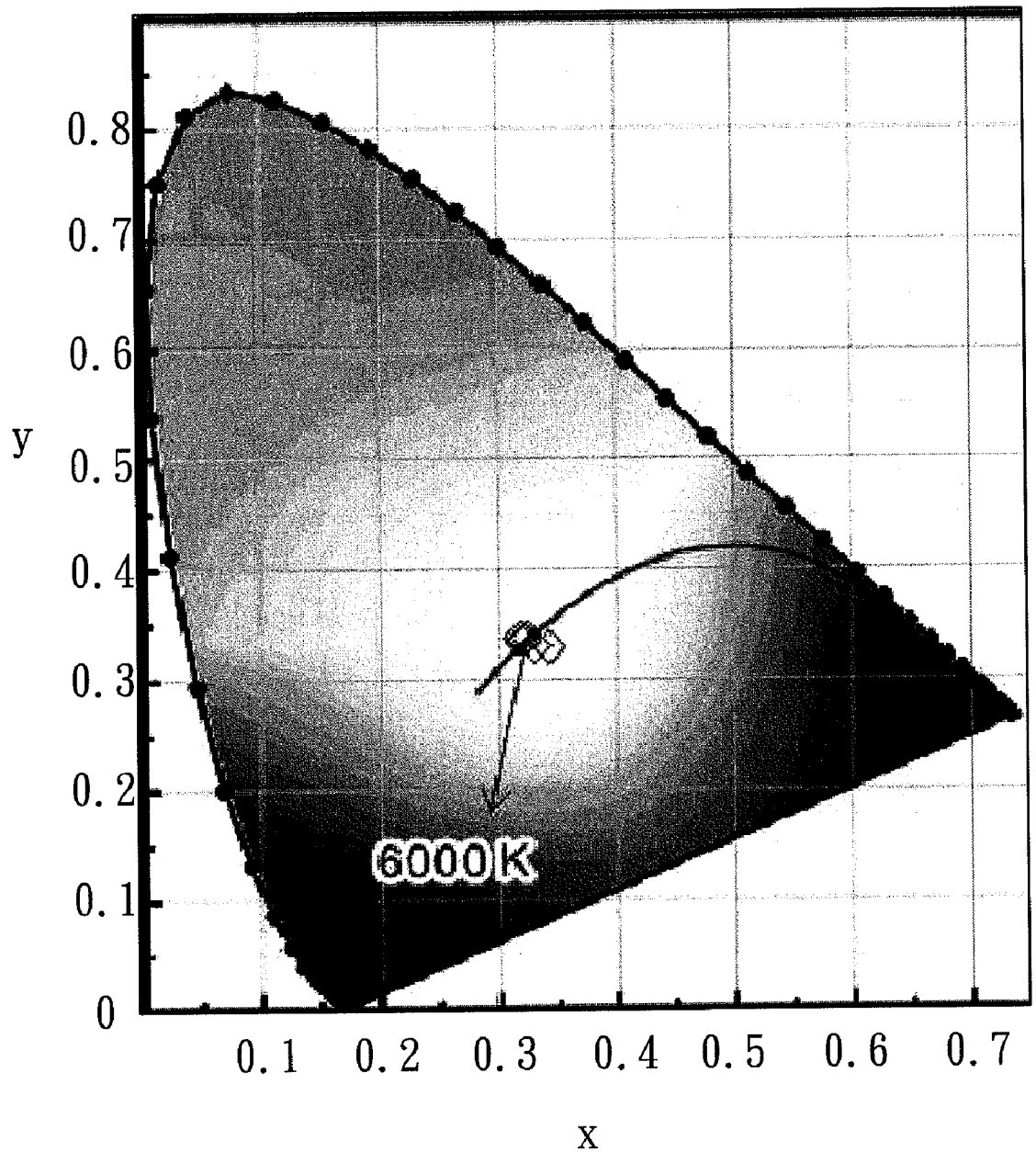
FIG. 1d is Commission internationale de l'éclairage (CIE) 1931 chromaticity coordinates of LED of FIG. 1a with injection currents from 5 mA to 25 mA.

FIGS. 1a to 1d show a light-emitting diode according to a preferred embodiment of the present invention, where FIG. 1a is a schematic diagram of nanorod-array LED structure for generating white light; FIG. 1b is a photograph of nanorod-array LED emitting white light at 20 mA injection current, and micro-electroluminescence (EL) images shown below are acquired under a 10× objective at various injection currents; FIG. 1c is a micro-EL image (20 mA) under a 100× objective revealing full-visible-spectrum emissions from the white LED shown in the photograph with scale bar: 10 µm, and FIG. 1d is Commission internationale de l'éclairage (CIE) 1931 chromaticity coordinates at injection currents from 5 mA to 25 mA in which the correlated color temperature (shown on the Planckian locus) maintains at near 6000 K (natural white light) for injection currents larger than 5 mA.

As shown in FIG. 1a, the light-emitting diode of the embodiment primarily includes a n-type silicon substrate 1, a Ti/Au electrode 2 disposed on the silicon substrate 1, a n-type gallium nitride (GaN) nanorod array 3 consisted of n-type GaN nanorods ohmic contacting with the Ti/Au electrode 2, one or more indium gallium nitride (InGaN) nanodisks 4 disposed on each of the n-type GaN nanorod 3, a p-type GaN nanorod array 5 consisted of p-type GaN nanorods disposed on top of the InGaN nanodisks 4 where one p-type GaN nanorod corresponds to one n-type GaN nanorod, and a Ni/Au electrode 6 ohmic contacting with the p-type GaN nanorod array 5. Notice that the Ti/Au electrode 2 may not directly contact but form a ohmic contact to the n-type GaN array 3 via the silicon substrate 1. In addition, Ni/Au electrode 6 is transparent, and each of the p-type GaN nanorods 5 has two ends whose one end near the transparent electrode 6 may be wider than the other end. This structure is helpful to prevent formation leakage current channels.

The white-light emission is realized by a stack of nanodisks 4 embedded in the GaN nanorod p-n junction 3/5 for the desired light mixing effects. It is important to know that each array of InGaN nanodisk contains a continuous distribution of emitters at different wavelengths, while the average emission wavelength can be controlled by growth temperature T and In/Ga beam fluxes. In this embodiment, the light-emitting diode contains three T1 InGaN nanodisks, one T2 InGaN nanodisk, and one T3 InGaN nanodisk, and the growth temperatures for T1, T2, and T3 are $T_1 > T_2 > T_3$. Notice that in other embodiments of the present invention, the number of the InGaN nanodisks including T1, T2, and T3 is not limited. In addition, a GaN barrier layer 7 is interposed between each two of the InGaN nanodisks 4. For conventional planar InGaN/GaN multiple quantum well structures, the InGaN active layer thickness has been limited to about 2-4 nm. Here, the embodiment takes full advantage of the strain-free nanodisk structure to stack nanodisks with varying thicknesses (for example, each InGaN nanodisk has a thickness about 10-25 nm). Furthermore, the number and position (with respect to the p-GaN region) of nanodisks s are very important to obtain the appropriate light mixing conditions for natural white emission (FIG. 1b). The thick InGaN nanodisks employed here provide larger and tunable active region volumes as well as improved carrier capture with reduced electron overflow at high currents. As will be shown later, the thick nanodisks can also lead to a solution to efficiency droop phenomenon. Additionally, the full-color emissions shown in FIG. 1c demonstrate a unique opportunity to fabricate nanorod-array LEDs with high color rendering capability. For the phosphor-based white LEDs, high color rendering would require a wide array of novel full-color phosphors, which will be a daunting task because of the required temperature stability, quantum efficiencies, and chemical robustness.

Figure 2A:
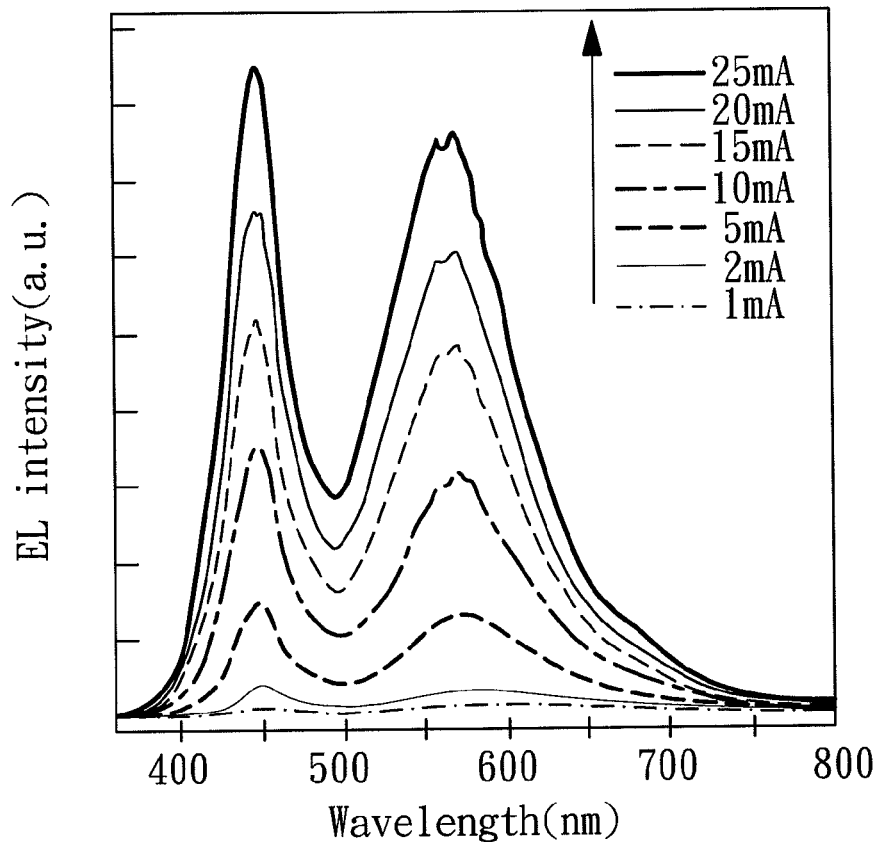
FIG. 2a is an electroluminescence (EL) spectra of InGaN/GaN nanorod-array white LED at injection currents from 1 mA to 25 mA according to the embodiment of the present invention.

FIG. 2a is an electroluminescence (EL) spectra of InGaN/GaN nanorod-array white LED at injection currents from 1 mA to 25 mA according to the preferred embodiment of the present invention. Two major peaks can be clearly identified at 448 nm (blue-band) and 569 nm (yellow-band) at 20 mA. The spectral blue shift with increasing current is negligibly small from 5 mA to 25 mA. This behavior illustrates that the QCSE is insignificant in InGaN nanodisk emitters. While full-color emissions are observed in the micro-EL image (FIG. 1c), two major peaks resulting from $T_1$ (blue-band) and $T_2$ (yellow-band) nanodisk arrays can be clearly identified, note that the contribution from the $T_3$ nanodisk array (extending into the red region) is weaker and mixed within the yellow-band. Both blue and yellow emission bands show negligibly small spectral blue shifts with increasingly current by 5-25 mA. From these EL spectra, it can be understood that the light mixing of blue- and yellow-band causes the white light emission shown in FIG. 1b. The small spectral blue-shifts with increasing current indicate insignificant polarization effects in the InGaN nanodisk emitters, which in turn results in the drive-current-insensitive correlated color temperatures measured for the nanorod-array white LED (FIG. 1d). The remaining slight shifts, 1.3 nm for the blue-band and 2.4 nm for the yellow-band, might result from a small spontaneous polarization mismatch between InGaN and GaN.

At present, the efficiency droop phenomenon of InGaN LEDs at high injection current densities is considered the major obstacle hindering high-brightness LEDs for general illumination applications. The exact physical origin of the efficiency droop has been under intense debate and several possible mechanisms have been proposed, such as Auger nonradiative recombination, carrier (electron) overflow, polarization fields, threading dislocations, etc. The embodiment of the present invention provides the thick and strain-free InGaN/GaN nanorod heterostructures that can overcome the efficiency droop phenomenon.

Figure 2B:
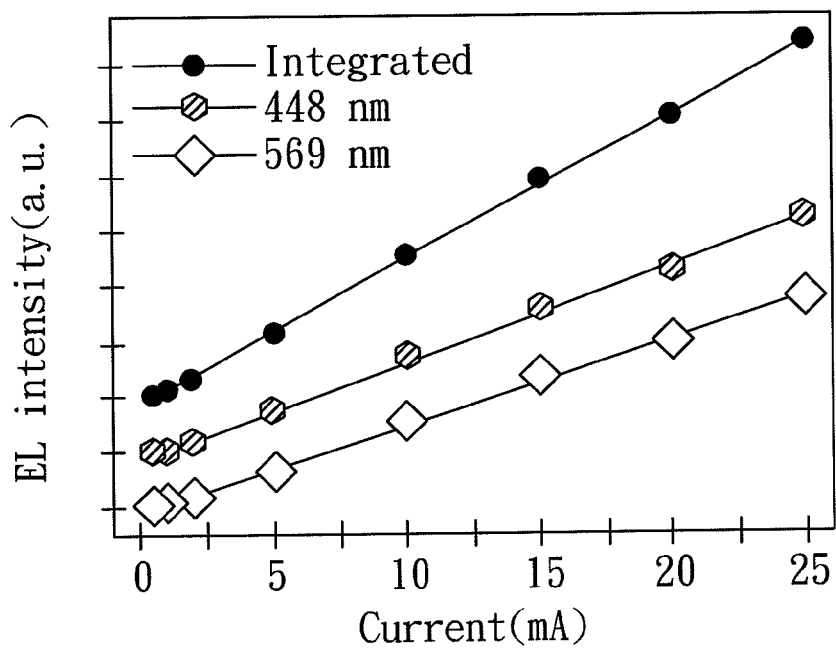
FIG. 2b shows plots of integrated and individual EL intensitites at two major peaks shown in FIG. 2a as functions of injection current.

FIG. 2b shows plots of EL intensity of integrated LED and EL intensity at two specific wavelengths of two major peaks in FIG. 2a as functions of injection current. Both the blue- and yellow-band intensities increase monotonically with increasing injection current at a constant slope, resulting in drive-current-insensitive white light emission. In addition, the integrated EL shows no sign of intensity degradation.

Although the injection current was tested only up to 25 mA (~53 A/cm$^2$ in current density), the actual current density passing through individual nanorod can be very high. To measure the maximum current density before the onset of efficiency droop, another embodiment provides a single-nanorod LED and its electrical and optical characterization.

Figure 3A:
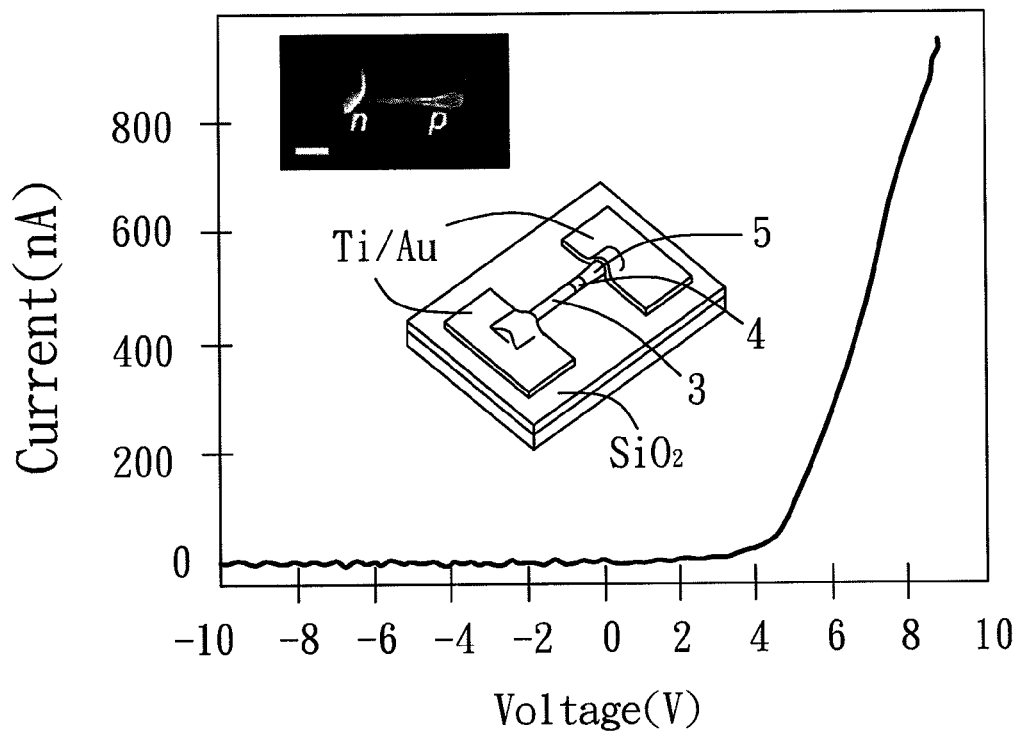
FIG. 3a is I-V curve of a single InGaN/GaN nanorod LED at room temperature according to an embodiment of the present invention.

FIG. 3a is I-V curve of a single InGaN/GaN nanorod LED at room temperature according to an embodiment of the present invention. No leakage current can be found at −10 V. Inset shows the field-emission scanning electron microscopy (FE-SEM) image and schematic diagram of the measured nanorod structure in which the rod length is about 2 μm. The single-nanorod LED includes only one InGaN nanodisk 4 with 90 nm in diameter and 40 nm in thickness. Scale bar indicates 500 nm. The measured I-V characteristics show a good diode behavior. Especially, single-nanorod diode show no signs of leakage currents, which allows for the measurement of actual current density passing through a single InGaN/GaN nanorod.

Figure 3B:
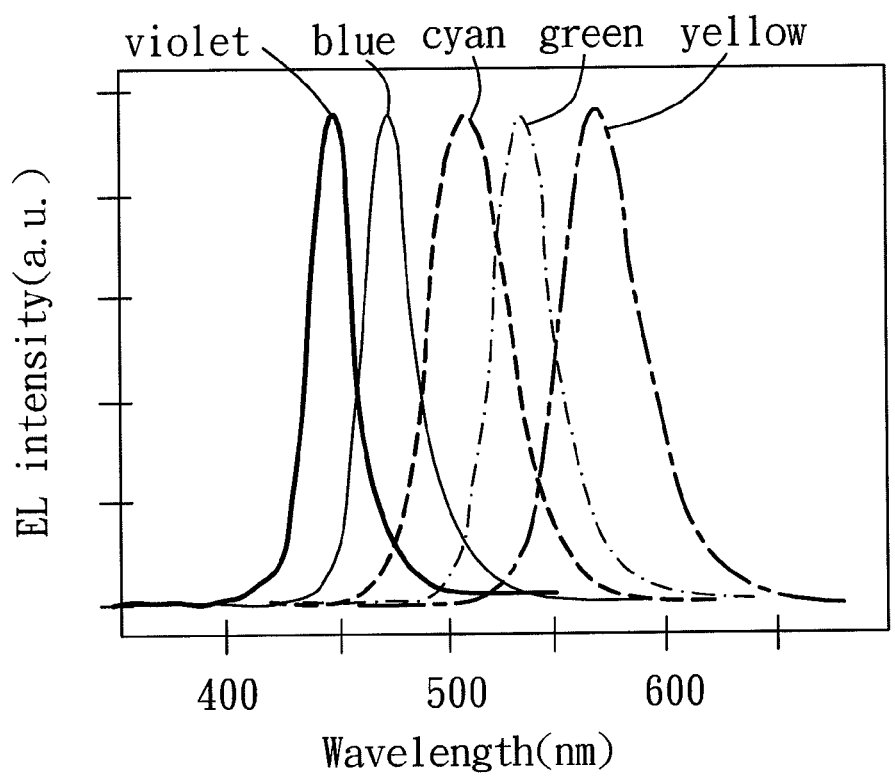
FIG. 3b shows normalized EL spectra of some single InGaN/GaN nanorod LEDs provided by embodiments of the present invention in which each single InGaN/GaN nanorod LED contains a single InGaN nanodisk.

FIG. 3b show normalized EL spectra of some single InGaN/GaN nanorod LEDS provided by embodiments of the present invention in which each single InGaN/GaN nanorod LED contains single InGaN nanodisk. The spectra show that the emissions from single InGaN nanodisks are monochromatic with narrow spectral widths (~25 nm). The corresponding optical microscopy images (not shown) of the diffraction-limited light emissions from single InGaN/GaN nanorod LEDs under forward bias current by 500 nA show color of violet, blue, cyan, green, and yellow, respectively.

Figure 3C:
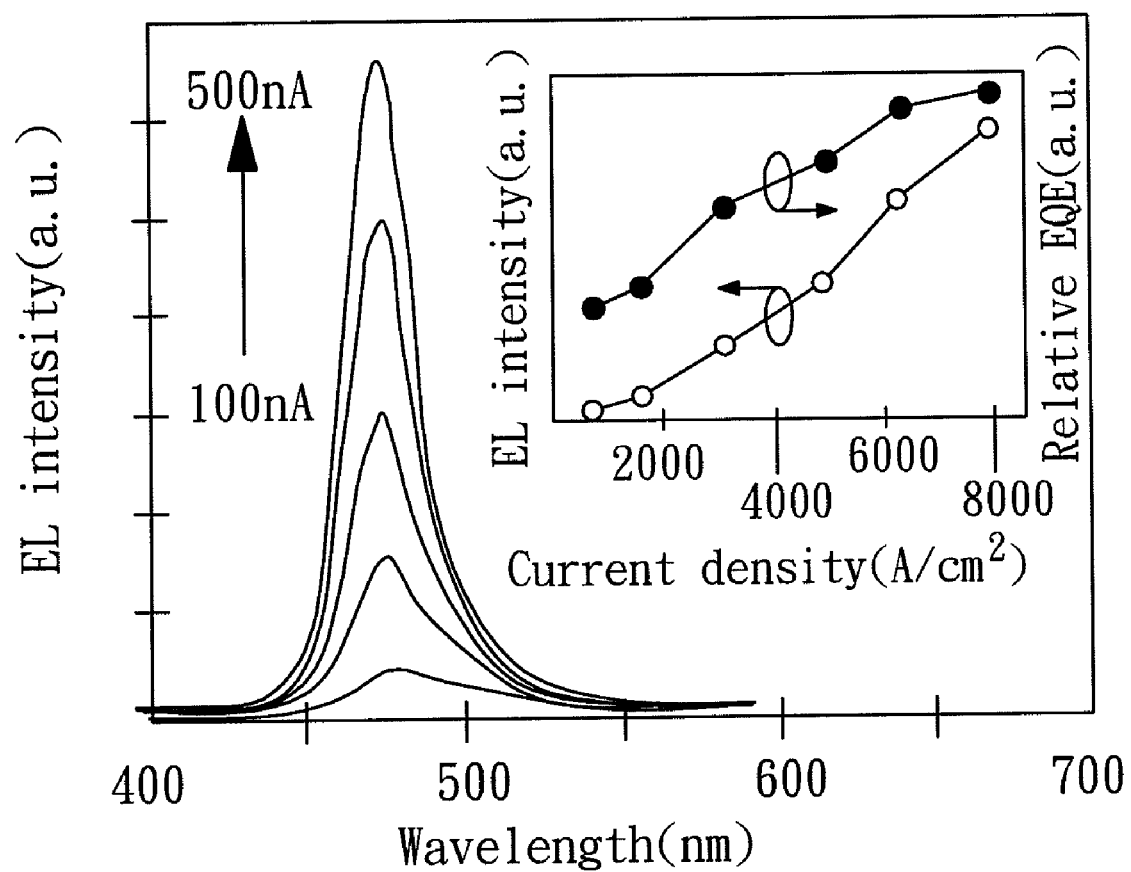
FIG. 3c shows EL spectra of the single InGaN/GaN nanorod LED shown in FIG. 3a emitting at 475 nm with increasing injection currents from 100 nA to 500 nA.

FIG. 3c shows EL spectra of a single InGaN/GaN nanorod LED emitting at 475 nm with injection currents from 100 nA to 500 nA. The single InGaN/GaN nanorod LED is the same diode measured in FIG. 3a. The acquired relations of EL intensity and relative external quantum efficiency (EQE) with respect to the injection current are shown in the inset. The relative EQE is estimated by EL intensity divided by the injection current and was measured by using a fixed emission collection geometry under DC injection mode. The relative EQE plot shows a trend of monotonic increase with increasing current density. In contrast, for conventional LEDs, this behavior holds only for current densities <10 A/cm$^2$. Using the known diameter (90 nm) of the nanorod, the maximum current density without showing efficiency degradation can be directly estimated to be 8,000 A/cm$^2$. This current density is extremely high in comparison with ~10 A/cm$^2$ for typical InGaN LEDs and ~200 A/cm$^2$ for an InGaN LED with a thick InGaN active layer. This high current density in single-nanorod LEDs without efficiency degradation is made possible by the thick (40 nm) and strain-free nanodisk structure employed in the present invention.

Figure 4A:
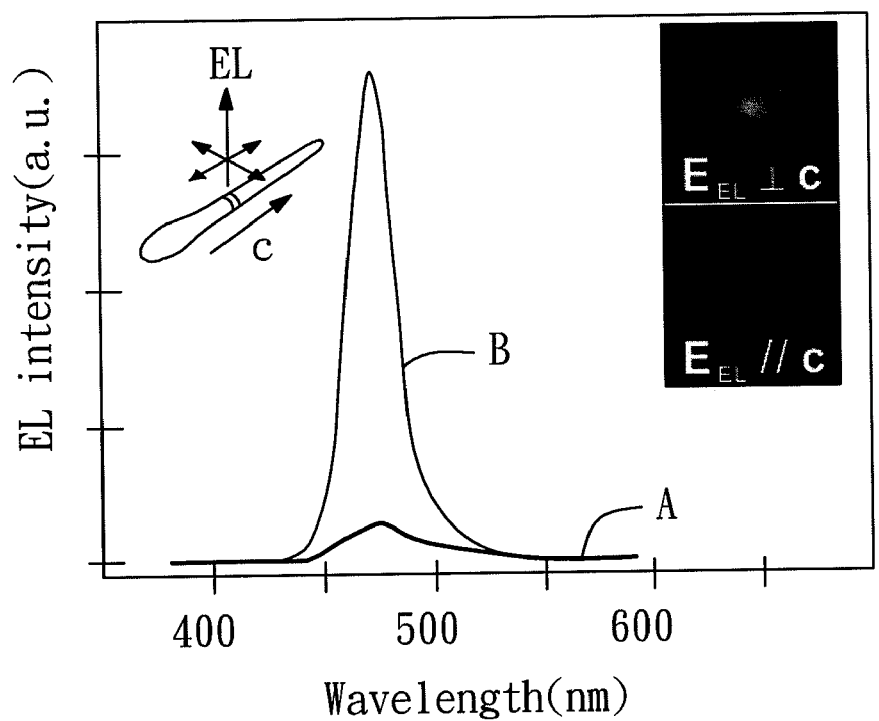
FIG. 4a shows polarized EL spectra of the single InGaN/GaN nanorod LED shown in FIG. 3a emitting at 475 nm. The injection current was set at 500 nA.

For some display applications, such as backlight displays, it is desirable to have polarized light emission from LEDs for improved system efficiencies. For nonpolar m-plane InGaN LEDs, there are already reports of large in-plane emission anisotropy, leading to possible backlighting applications in liquid crystal displays. In contrast, conventional polar c-plane InGaN LEDs exhibit no such properties. Here the present invention shows that the EL emission from polar nanorod heterostructures of the embodiments can be highly polarized. FIG. 4a show polarized EL spectra of a single InGaN/GaN nanorod LED (the same structure shown in FIG. 3a) at 500 nA injection current. These spectra were recorded with the emission polarization oriented parallel (curve A, $E_{EL}//c$) and perpendicular (curve B, $E_{EL} \perp c$) to the nanorod axis (the c-axis of the wurtzite crystal structure). The polarization ratio ρ is defined as $\rho=(I_\parallel - I_\perp)/(I_\parallel + I_\perp)$, where $I_\parallel$ and $I_\perp$ are the EL intensities corresponding to the electric fields of EL ($E_{EL}$) parallel and perpendicular to the c-axis (the nanorod axis), respectively. The measured polarization ratio is −0.85. The insets of FIG. 4a show the corresponding optical microscopy images under a 100× objective.

Figure 4B:
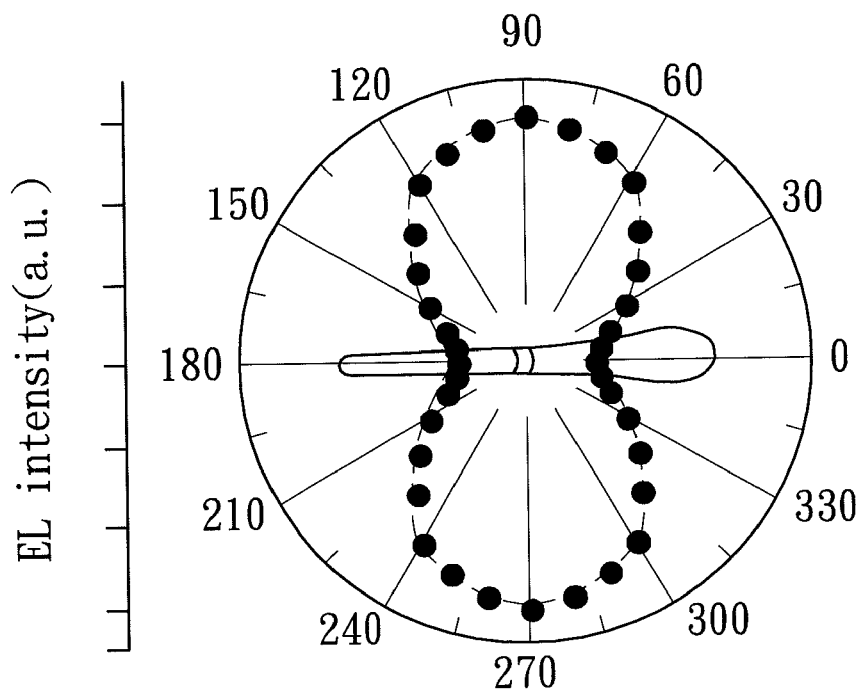
FIG. 4b shows the measured polar plot of integrated EL of the single InGaN/GaN nanorod LED shown in FIG. 3a emitting at 475 nm in which the linearly polarized EL intensity is plotted as a function of the emission polarization with respect to the nanorod long axis.

FIG. 4b shows the measured polar plot of linearly polarizaed EL intensity as a function of the emission polarization with respect to the nanorod long axis. A measured polarization ratio of −0.85 represents a high degree of EL polarization, as evidenced in FIG. 4b. Unlike most of the polarized emission from nanorod or nanowire luminescent materials, the observed EL anisotropy is oriented perpendicular to the nanorod axis (a negative ρ value). A previous study has identified that the optical confinement effect in single GaN nanorods (<100 nm in width) is the cause of polarized luminescence. In this mechanism, the polarization ratio is a function of emission wavelength and nanorod diameter. On the contrary, experiments of the present invention show that the polarized luminescence with negative ρ is from the InGaN nanodisk structure embedded in the GaN nanorod. Additionally, the measured negative values of ρ show weak dependences on the emission wavelength or diameter of the InGaN nanodisks. This behavior is very favorable for future applications requiring polarized light emission.

In summary, using both nanorod-array and single-nanorod LEDs, the present invention demonstrates that the LED device structure based on thick and strain-free InGaN nanodisk emitters embedded in the self-assembled GaN nanorods can overcome the existing white LED technology limitations, such as the green-yellow gap and the efficiency degradation phenomenon under high-power operation. These devices do not require special nanofabrication techniques and have excellent scaling capability on Si substrates. In addition, the high flexibility in designing InGaN nanodisk emitter structures allows further device optimization for novel lighting and display applications.

Example of Producing White-Light InGaN/GaN Nanorod-Array LEDs.

The InGaN/GaN nanorod array samples were grown on 3-inch, P-doped n-type Si(111) (resistivity: 0.001-0.005 Ωcm) wafers by nitrogen-plasma-assisted molecular beam epitaxy (PAMBE) under nitrogen-rich conditions, in comparison to the group-III/nitrogen flux ratio used for III-nitride film growth. The custom-made PAMBE system (DCA Instruments, DCA-600) is equipped with a large radio-frequency nitrogen plasma source (ADDON). The nitrogen plasma source during the growth procedure was at a nitrogen gas flow rate of 3 sccm (standard cubic centimeter per minute) under 500 W RF forward power. The in-situ reflection high energy electron diffraction (RHEED) observation confirms that the PAMBE-grown nanorods are wurtzite-type single crystals (the nanorod axial growth direction is along the wurtzite c-axis). The in-plane crystallographic axes of the nanorods are found to be the following epitaxial relation: $<2\bar{1}\bar{1}0>\|<\bar{1}10>_{Si}$; $<1\bar{1}00>\|<11\bar{2}>_{Si}$. Prior to the InGaN nanodisk growth, Si-doped n-type GaN nanorod array (~1 μm in height) was grown first on the Si(111) substrate at 770° C. (growth temperature) [Ga beam equivalent pressure ($BEP_{Ga}$): $9\times10^{-8}$ Torr]. Subsequently, InGaN nanodisks were grown on top of the n-type GaN nanorods. The emission wavelengths of InGaN nanodisks were controlled by the growth temperature (T) and group-III beam fluxes. In FIG. 1a, three nanodisk growth temperature are $T_1>T_2>T_3$ ($T_1$: 705° C., $T_2$: 700° C., $T_3$: 690° C.). In this structure, which was used for fabricating nanorod-array white LEDs, three $T_1$ nanodisks ($BEP_{Ga}$: $7.5\times10^{-8}$ Torr; $BEP_{In}$: $2.6\times10^{-8}$ Torr; thickness of InGaN/GaN: ~25 nm/25 nm), one $T_2$ nanodisk ($BEP_{Ga}$: $6.2\times10^{-8}$ Torr; $BEP_{In}$: $3.3\times10^{-8}$ Torr; thickness of InGaN/GaN: ~10 nm/25 nm), and one $T_3$ nanodisk ($BEP_{Ga}$: $5.7\times10^{-8}$ Torr; $BEP_{In}$: $3.7\times10^{-8}$ Torr; thickness of InGaN/GaN ~15 nm/25 nm) were used to generate the white light emission. The thickness of each InGaN nanodisk ranges from 10 to 25 nm and the GaN barrier thickness is fixed at 25 nm, as shown schematically in FIG. 1a. On top of the $T_3$ InGaN nanodisk, Mg-doped p-type GaN nanorods (~1 μm in height) were grown at 690° C. The Ga/N flux ratio was then gradually increased to induce lateral growth of p-type GaN nanorods, thereby forming a quasi-continuous p-type GaN top film.

White LED devices were fabricated first by dry etching technique (inductively coupled plasma, ICP) to form mesas of 260×280 μm² in size (effective current passing area: ~47,100 μm²). For the purpose of LED isolation, the exposed GaN nanorod part was etched into the Si substrate using a SiO₂ etch mask. Contact metals were then evaporated in a $10^{-7}$ Torr vacuum. The ohmic contact to n-type Si(111) and p-type GaN layers are Ti/Au (60 nm/40 nm) and Ni/Au (15 nm/35 nm). The Ni/Au top contact was thin enough to be transparent for the emitted light.

The current-voltage (I-V) characteristics of InGaN/GaN nanorod-array white LEDs were measured at room temperature using a Keithley 2400 SourceMeter unit. For the electroluminescence (EL) and photoluminescence (PL) measurements, a home-built optical spectroscopic system combined with a probing station was used in this study. The EL signal was collected at room temperature with a 10× objective (Mitutoyo, NA=0.28) and dispersed by a spectrometer (HR460, Jobin-Yvon) equipped with a liquid-nitrogen-cooled CCD detector. The spectral response of CCD-spectrometer was calibrated in advance using a NIST-traceable tungsten halogen light source (Ocean Optics, HL-2000-CAL).

Example of Producing Monochromatic InGaN/GaN Single-Nanorod LED.

The InGaN/GaN single-nanorod LED structure used in the present invention was grown on a 3-inch, n-type Si(111) wafer by PAMBE. First, 1.2 μm, n-type GaN nanorods were grown at 770° C., and then 40-nm-thick InGaN nanodisks were grown on top of the n-type GaN nanorods ($BEP_{Ga}$:$3.5\times10^{-8}$ Torr; $BEP_{In}$: $2.6\times10^{-8}$ Torr) at 705° C. Finally, 800 nm, p-type GaN nanorods were grown on top of the InGaN nanodisks at 685° C.

After PAMBE growth, this sample was dipped in 1% hydrogen fluoride (HF) solution for 30 seconds to remove native oxide covered on the nanorods. Then the samples were suspended in isopropanol solution with sonic bath and later were dispersed onto an oxidized (~500-nm-oxide covered) silicon substrate. The electrodes were patterned by a standard photolithography and lift off process. Both of the ohmic contacts to n-type and p-type electrodes are Ti/Au (20 nm/35 nm). Contact metals were electron-beam evaporated in a vacuum chamber and the base pressure was in the $10^{-7}$ Torr range. After the contact evaporation process, the LED devices were thermal annealled at 600° C. for 20 seconds in a vacuum chamber with the base pressure in the $10^{-9}$ Torr range.

The single-nanorod LED may have some particular applications. In one embodiment, the single nanorod light-emitting diode is used as the light source for subwavelength optical lithography in the contact or proximity printing mode for photoresists photo-active at the emission wavelengths, wherein the photoresists are within the near-field of the single rod light-emitting diode. The subwavelength optical lithography can be performed by raster scanning the single rod light-emitting diode with respect to the photoresists. In one embodiment, The single rod light-emitting diode is used as the light source for subwavelength optical imaging of objects placed within the within the near-field of the single rod light-emitting diode. The subwavelength optical imaging can be performed by raster scanning the single rod light-emitting diode with respect to the imaged objects.

A Keithley 2400 SourceMeter unit and a Zyvex S100 nano-probing system installed in a field-emission scanning microscope (FE-SEM, Zeiss, Ultra 55) were used for the measurements of I-V characteristics at room temperature. The micro-EL signal was collected at room temperature with a 100× objective (Mitutoyo, NA=0.5).

Although specific embodiments have been illustrated and described, it will be appreciated by those skilled in the art that various modifications may be made without departing from the scope of the present invention, which is intended to be limited solely by the appended claims.

What is claimed is:

1. A light-emitting diode, comprising: a first electrode; a n-type gallium nitride (GaN) nanorod array consisted of n-type GaN nanorods ohmic contacting with the first electrode; one or more indium gallium nitride (InGaN) nanodisks disposed on each of the n-type GaN nanorods; a p-type GaN nanorod array consisted of p-type GaN nanorods, wherein one p-type GaN nanorod is corresponded to one n-type GaN nanorod and is disposed on top of the one or more InGaN nanodisks of the corresponded n-type GaN nanorod; and a second electrode ohmic contacting with the p-type GaN nanorod array; wherein wavelengths of electroluminescent emissions of the light-emitting diode are insensitive to an increase of an injection current.

2. The light-emitting diode as recited in claim 1, wherein the one or more InGaN nanodisks comprise two or more InGaN nanodisks, and a GaN barrier is interposed between each two of the InGaN nanodisks.

3. The light-emitting diode as recited in claim 1, wherein the electroluminescence emissions from the one or more InGaN nanodisks are monochromatic or polychromatic.

4. The light-emitting diode as recited in claim 1, wherein the electroluminescence emissions from the light-emitting diode are polarized.

5. The light-emitting diode as recited in claim 1, wherein each indium gallium nitride (InGaN) nanodisk has a thickness equal to or more than 10 nm.

6. The light-emitting diode as recited in claim 5, wherein each indium gallium nitride (InGaN) nanodisk has a thickness about 10 nm to 40 nm.

7. The light-emitting diode as recited in claim 1, wherein the color temperature emitted from the light-emitting diode is independent on the injection current of the light-emitting diode.

8. The light-emitting diode as recited in claim 7, wherein the color temperature emitted from the light-emitting diode is maintained at about 6,000 K for injection currents larger than 5 mA.

9. The light-emitting diode as recited in claim 1, wherein the relative external quantum efficiency (EQE) is monotonously increased when the current density of injection currents is increased to above 50 A/cm$^2$.

10. The light-emitting diode as recited in claim 1, wherein the first electrode or the second electrode is a transparent electrode, and each of the p-type GaN nanorods or n-type GaN nanorods near the transparent electrode has two ends in which one end near the transparent electrode is wider than the other end, thereby forming a continuously connected nanorod network without current leakage.

11. The light-emitting diode as recited in claim 1, wherein an emission color of the light-emitting diode is determined by the number and thickness of the one or more indium gallium nitride (InGaN) nanodisks and the light-emitting diode is capable of emitting a white light or a color light within the full visible spectrum.

12. A light-emitting diode, comprising: a first electrode; a n-type gallium nitride (GaN) nanorod ohmic contacting with the first electrode; one or more indium gallium nitride (InGaN) nanodisks disposed on the n-type GaN nanorod; a p-type GaN nanorod disposed on top of the one or more InGaN nanodisks; and a second electrode ohmic contacting with the p-type GaN nanorod; wherein wavelengths of electroluminescent emissions of the light-emitting diode are insensitive to an increase of an injection current.

13. The light-emitting diode as recited in claim 12, wherein the one or more InGaN nanodisks comprise two or more InGaN nanodisks, and a GaN barrier is interposed between each two of the InGaN nanodisks.

14. The light-emitting diode as recited in claim 12, wherein the electroluminescence emissions from the one or more InGaN nanodisks are monochromatic or polychromatic.

15. The light-emitting diode as recited in claim 12, wherein the electroluminescence emissions from the light-emitting diode are polarized.

16. The light-emitting diode as recited in claim 15, wherein the electroluminescence emissions from the light-emitting diode have a polarization ratio substantially independent on the wavelengths of the electroluminescence emissions and the diameter of the one or more InGaN nanodisks.

17. The light-emitting diode as recited in claim 12, wherein current density exerted to the light emitting diode reaches 8,000 A/cm$^2$ or more.

18. The light-emitting diode as recited in claim 12, wherein each InGaN nanodisk of the one or more InGaN nanodisks has a thickness equal to or more than 10 nm.

19. The light-emitting diode as recited in claim 12, wherein the light-emitting diode is used as a light source for a subwavelength optical lithography in a contact or a proximity printing mode for photoresists photo-active at the emission wavelengths, and wherein the photoresists are within the near-field of the light-emitting diode.

20. The light-emitting diode as recited in claim 19, wherein the subwavelength optical lithography is performed by raster scanning the light-emitting diode with respect to the photoresists.

21. The light-emitting diode as recited in claim 12, wherein the light-emitting diode is used as a light source for a subwavelength optical imaging of an object placed within the near-field of the light-emitting diode.

22. The light-emitting diode as recited in claim 21, wherein the subwavelength optical imaging is performed by raster scanning the light-emitting diode with respect to the object.

23. A method for producing a light-emitting diode, comprising: forming a first electrode; forming a n-type gallium nitride (GaN) nanorod array consisted of one or more n-type GaN nanorods that ohmic contacts with the first electrode; forming one or more indium gallium nitride (InGaN) nanodisks on each of the n-type GaN nanorod; forming a p-type GaN nanorod array consisted of one or more p-type GaN nanorods, wherein one p-type GaN nanorod is corresponded to one n-type GaN nanorod and is formed on top of the one or more InGaN nanodisks of the corresponded n-type GaN nanorod; and forming a second electrode that ohmic contacts with the p-type GaN nanorod array wherein the n-type gallium nitride (GaN) nanorod array, the indium gallium nitride (InGaN) nanodisks, and the p-type gallium nitride (GaN) nanorod array are formed by a nitrogen-plasma-assisted molecular beam epitaxy method.

24. The method as recited in claim 23, wherein the n-type or p-type gallium nitride (GaN) nanorods are wurtzite-type single crystals in which the axial growth direction of the nanorods is along the wurtzite c-axis.

25. The method as recited in claim 23, wherein the nitrogen-plasma-assisted molecular beam epitaxy (PAMBE) is performed under nitrogen-rich conditions, in comparison to a group-III/nitrogen flux ratio used for an III-nitride film growth.

26. The method as recited in claim 25, wherein the emission wavelength of each InGaN nanodisk is individually controlled by its growth temperature and the group-III beam fluxes.

27. The method as recited in claim 26, wherein the one or more indium gallium nitride (InGaN) nanodisks comprises one or more T1 InGaN nanodisks, one or more T2 InGaN nanodisks, and one or more T3 InGaN nanodisks, and the growth temperatures for T1, T2, and T3 are $T_1 > T_2 > T_3$.

28. The method as recited in claim 27, wherein the combined electroluminescence from T1, T2, and T3 InGaN nanodisks produces white light luminescence.

29. The method as recited in claim 23, when forming two or more InGaN nanodisks, a GaN barrier is further formed between each two of the InGaN nanodisks.

30. A light-emitting diode, comprising: a first electrode; a n-type gallium nitride (GaN) nanorod array consisted of n-type GaN nanorods ohmic contacting with the first electrode; one or more indium gallium nitride (InGaN) nanodisks disposed on each of the n-type GaN nanorods; a p-type GaN nanorod array consisted of p-type GaN nanorods, wherein one p-type GaN nanorod is corresponded to one n-type GaN nanorod and is disposed on top of the one or more InGaN nanodisks of the corresponded n-type GaN nanorod; and a second electrode ohmic contacting with the p-type GaN nanorod array; wherein an emission color of the light-emitting diode is determined by the number and thickness of the one or more indium gallium nitride (InGaN) nanodisks and the light-emitting diode is capable of emitting a white light.

* * * * *